US 6,992,498 B2

(12) United States Patent
Pröll et al.

(10) Patent No.: US 6,992,498 B2
(45) Date of Patent: Jan. 31, 2006

(54) TEST APPARATUS FOR TESTING INTEGRATED MODULES AND METHOD FOR OPERATING A TEST APPARATUS

(75) Inventors: Manfred Pröll, Dorfen (DE); Gerrit Färber, Freiburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/791,768

(22) Filed: Mar. 4, 2004

(65) Prior Publication Data

US 2004/0201395 A1 Oct. 14, 2004

(30) Foreign Application Priority Data

Mar. 7, 2003 (DE) .................................. 10310140

(51) Int. Cl.
*G01R 31/28* (2006.01)

(52) U.S. Cl. .................................. 324/765; 324/158.1

(58) Field of Classification Search ........ 324/760–765, 324/73.1, 158.1; 714/726–733; 365/200–201
See application file for complete search history.

(56) References Cited

U.S. PATENT DOCUMENTS

| 4,857,774 | A | * | 8/1989 | El-Ayat et al. ................. 326/16 |
| 5,389,556 | A | | 2/1995 | Rostoker et al. |
| 5,519,713 | A | * | 5/1996 | Baeg et al. .................. 714/724 |
| 5,528,600 | A | * | 6/1996 | El Ayat et al. .............. 714/730 |
| 5,872,458 | A | * | 2/1999 | Boardman et al. .......... 324/758 |
| 5,930,269 | A | | 7/1999 | Tsukamoto et al. |

* cited by examiner

*Primary Examiner*—Vinh P. Nguyen
(74) *Attorney, Agent, or Firm*—Edell, Shapiro & Finnan, LLC

(57) ABSTRACT

A test apparatus for testing integrated modules has a plurality of connection locations on a carrier substrate. An integrated module may be connected, via a connection location, to a test unit connected to the carrier substrate. The connection locations are arranged in groups within a connection array. A control terminal via which an integrated module may be selected for a test can be provided for each connection location. An address and command terminal can be provided for each connection location. The modules of the number of groups, which are simultaneously operated, are connected to the address and command bus via the respective switching means or switch. The test frequency can thus be increased without adversely affecting the driver load.

18 Claims, 2 Drawing Sheets

Stand der Technik

TEST APPARATUS FOR TESTING INTEGRATED MODULES AND METHOD FOR OPERATING A TEST APPARATUS

CROSS REFERENCE TO RELATED APPLICATIONS

This application claims priority under 35 USC § 119 to German Application No. 10310140.3, filed on Mar. 7, 2003, and titled "Test Apparatus for Testing Integrated Modules and Method for Operating a Test Apparatus," the entire contents of which are hereby incorporated by reference.

FIELD OF THE INVENTION

The present invention relates to a test apparatus for testing integrated modules having a carrier substrate and to a method for operating a test apparatus of this type.

BACKGROUND

In order to keep the failure rate of integrated modules as low as possible following the fabrication thereof, the manufacturer subjects integrated modules such as, for example, DRAM memories to a burn-in test (or stress test), in particular, in which the modules are artificially aged. A burn-in test of this type is intended to sort out those integrated modules, which fail after a short operating time, so that the user receives modules which attain a defined service life.

In order to artificially age an integrated module, a relatively high voltage, in particular, is applied to the latter in the burn-in test, said voltage causing the module to artificially age relatively quickly, with the result that the ageing process is accelerated in a relatively small amount of elapsed test time. In addition or as an alternative, the modules are exposed to an elevated ambient temperature, thus accelerating the aging process. In order to carry out a burn-in test, the modules are arranged within a test apparatus on a carrier substrate, on which a plurality of connection locations are arranged. An integrated module is placed onto the respective connection location, with the result that the corresponding module may be connected, via a connection location, to a test unit connected to the carrier substrate.

When carrying out a burn-in test of integrated modules such as, for example, DRAMs, a high level of parallelism is usually required in order to achieve a high throughput. This results in the requirement that many modules are driven at the same time in order to achieve as high a throughput as possible in the case of a comparatively long burn-in test which may last for a plurality of hours. However, the disadvantage of this high level of parallelism is a resultant reduced edge steepness of signals of the modules to be tested and an associated lower possible operating frequency. Increased demands are furthermore imposed on the power supply of the carrier substrate, the burn-in board, where the power supply is often being fully utilized and thus limiting the number of modules per burn-in board. The disadvantages described are present during a functional test in which, although the modules are not stressed, they are, for reasons of test economy, located on the burn-in board in order, for example, to be able to carry out a functional test at increased operating frequency using the high level of parallelism (test during burn-in).

FIG. 2 shows a test apparatus for testing integrated modules according to the prior art. Such test apparatus can be used to achieve a high level of parallelism. A burn-in test unit 2 is connected to the carrier substrate 10, on which a plurality of connection locations 11 to nk are arranged. The connection locations are designed such that an integrated module DUT may be connected, via a respective connection location, to the test unit 2 connected to the carrier substrate 10. Since a burn-in test unit generally has a limited number of inputs, the connection locations 11 to nk are arranged in a matrix-type connection array. More modules to be tested than input channels (present on the tester side) are therefore located on the burn-in board.

For the purposes of driving the modules DUT, the connection array is divided into groups, the individual groups being read sequentially via the control signals SCAN-1 to SCAN-n. This SCAN signal is connected to the DQM pin on the module to be tested. The pin masking the output drivers of the modules, which, despite internal execution of commands in the module, therefore, do not output any signals. Control signals, such as addresses and commands, are fed simultaneously into all of the modules via the address and command bus CMD/ADD. The data are output by the respective module at the data output DQ, depending on driving of the DQM signal, and the addresses and commands are read in via the address and command terminal A/C.

In the test apparatus shown in FIG. 2, all or none of the modules DUT will operate internally. The SCAN signal is accorded a function for reading out data in order to activate the output drivers of the desired group of modules via the respective DQM pin. In particular, in a test during burn-in (described above), the driver load on the address and command bus CMD/ADD is comparatively high as a result of the parallel operation of the modules, with the result that the address and command signals are subject to a resultant reduced edge steepness. High demands are furthermore imposed on the power supply of the burn-in board during tests of this type.

SUMMARY

A test apparatus for testing integrated modules may be used to operate the modules at increased frequency in a functional test or may be used, for the same load, to increase the number of modules, which can be arranged on the carrier substrate.

Also, a corresponding method for operating a test apparatus of this type is possible.

In the test apparatus according to the invention, the connection locations can be arranged in groups within a connection array. A data terminal can be provided for each connection location. The data terminals of connection locations of a respective group can be connected to a respective different data bus. A control terminal, via which an integrated module may be selected for a test, can be provided for each connection location. The control terminals of connection locations of a respective group can be connected to a control bus assigned to this group. An address and command terminal can be provided for each connection location. It is possible for the address and command terminals of connection locations of a respective group to be connected to an address and command bus via a switching means, which is assigned to the respective group and may be controlled by the control bus assigned to this group.

The test apparatus according to the invention for testing integrated modules can make it possible to operate the modules at a higher frequency in a functional test since individual groups of connection locations may be selected via the control bus and modules of selected groups can be correspondingly selected for a test. Also, the selected connection locations can be connected to the address and command bus via the switching means, which is driven by the respective control bus. As a result, the driver load on the address and command bus of the test apparatus can decrease since address and command terminals of modules of a selected group or of a plurality of selected groups are connected to the address and command bus. At the same time, the demands imposed on the power supply of the test apparatus can decrease since modules of selected groups are selected via the respective control bus, and consequently, the other modules, which have not been selected, are switched off or are in a standby state. Thus, the effective load can be reduced or, for the same load, the number of modules, which can be arranged on the carrier substrate, can be increased.

In a corresponding operating method, at least some of the connection locations on the carrier substrate can be connected to integrated modules to be tested. Driving the corresponding control bus(es) can simultaneously operate and drive modules of a number of groups. This number can be smaller than the number of groups present on the carrier substrate. The modules of the number of groups, which are simultaneously operated, can be connected to the address and command bus via the respective switching means or switch. In particular, modules, which interchange data via the assigned data bus, can be operated and driven by address and command signals.

Functional tests, such as a test during burn-in, can be carried out. The modules can be subject, with a high level of parallelism, to a burn-in test on a burn-in board and, in a subsequent functional test, can be operated at increased operating frequency using the test infrastructure of the burn-in board.

BRIEF DESCRIPTION OF THE FIGURES

The invention is explained in more detail below with reference to the figures, which are illustrated in the drawing, in which.

DETAILED DESCRIPTION

Figure 1:
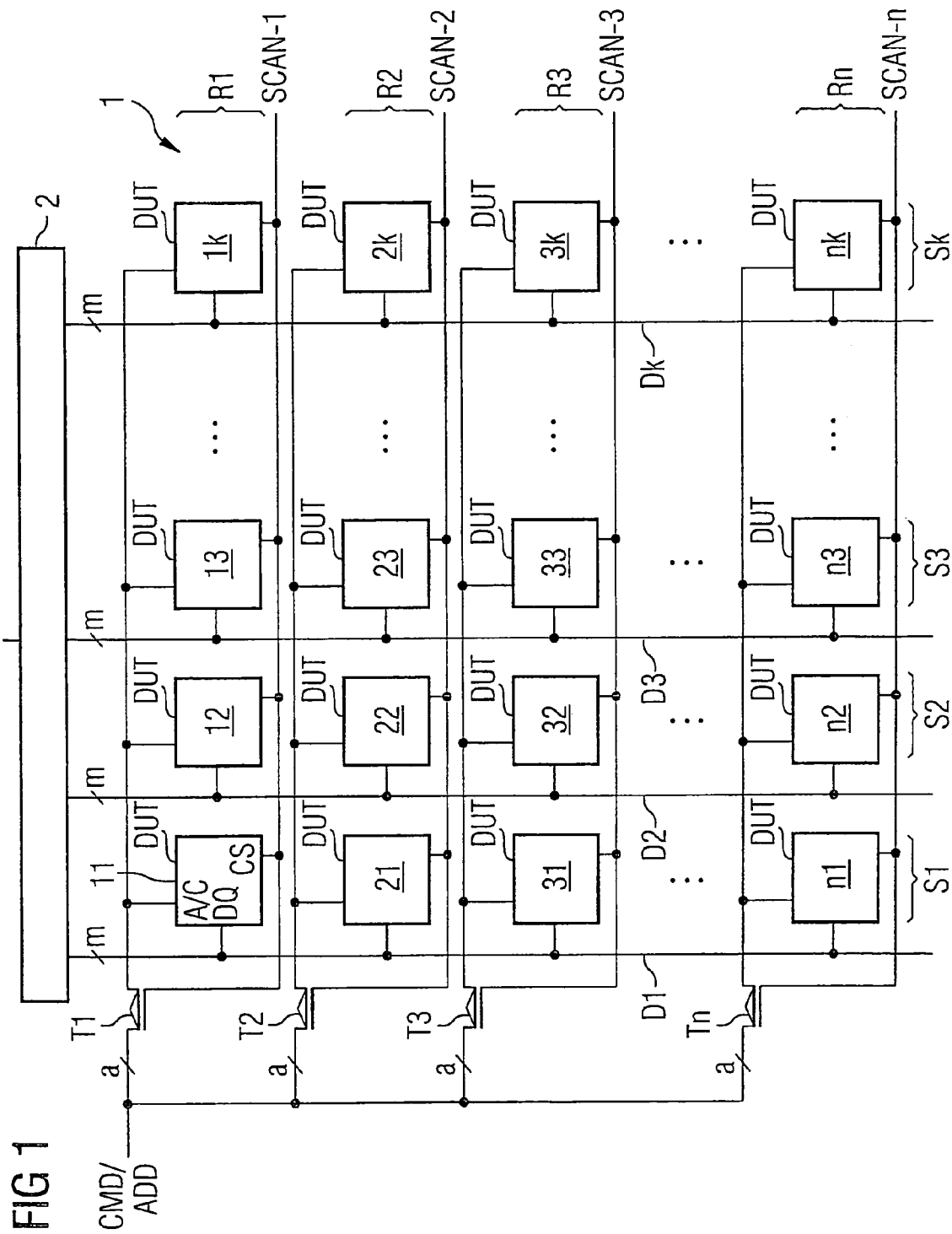
FIG. 1 shows an embodiment of a test apparatus in accordance with the invention.

FIG. 1 shows an embodiment of a test apparatus according to the invention for testing integrated modules. The test apparatus includes a plurality of connection locations 11 to nk arranged on a carrier substrate 1, i.e., a burn-in board in the present case. The connection locations 11 to nk can be designed such that an integrated module DUT may be connected, via a connection location, to a test unit 2 connected to the carrier substrate 1. The connection locations 11 to nk can form a connection array, which, in the present case, is constructed in the form of a matrix in columns S1 to Sk and rows R1 to Rn. In this case, the connection locations can be arranged in groups within the connection array. The groups can be formed by the respective rows R1 to Rn.

A data terminal DQ can be provided for each connection location, the data terminals DQ of connection locations of a respective row being connected to a respective different data bus D1 to Dk. A control terminal CS, via which an integrated module DUT may be selected for a test, can be provided for each connection location. The control terminals CS of connection locations of a respective row R1 to Rn can be connected to a control bus SCAN-1 to SCAN-n assigned to this row. The address and command terminals A/C of connection locations of a row R1 to Rn can be connected to a common address and command bus CMD/ADD via a respective switching means T1 to Tn. The switching means can be controlled by the control bus SCAN-1 to SCAN-n assigned to the row. Data terminals DQ of connection locations along a column S1 to Sk can be connected to the data bus D1 to Dk to be assigned to this column. For reasons of clarity, the terminals DQ, A/C, CS have been illustrated in FIG. 1 with reference to the connection location 11, the other connection locations 12 to nk having analogous terminals. The data buses D1 to Dk can have the bit width m, for example, m=4, and the address and command bus CMD/ADD can have the bit width a, for example, a=6.

In a method for operating a test apparatus as shown in FIG. 1, at least some of the connection locations 11 to nk on the carrier substrate 1 can be connected to integrated modules DUT, in particular, DRAMs, to be tested. Driving one or more control buses simultaneously operates modules of a number of rows. This number can be smaller than the number of rows present on the carrier substrate 1. By way of example, driving the control bus SCAN-1 can select the group R1, with the result that the modules of this row R1 are operated via the control input CS. The modules DUT of this row R1, which are simultaneously operated, can be connected to the address and command bus CMD/ADD via the switching means T1.

Figure 2:
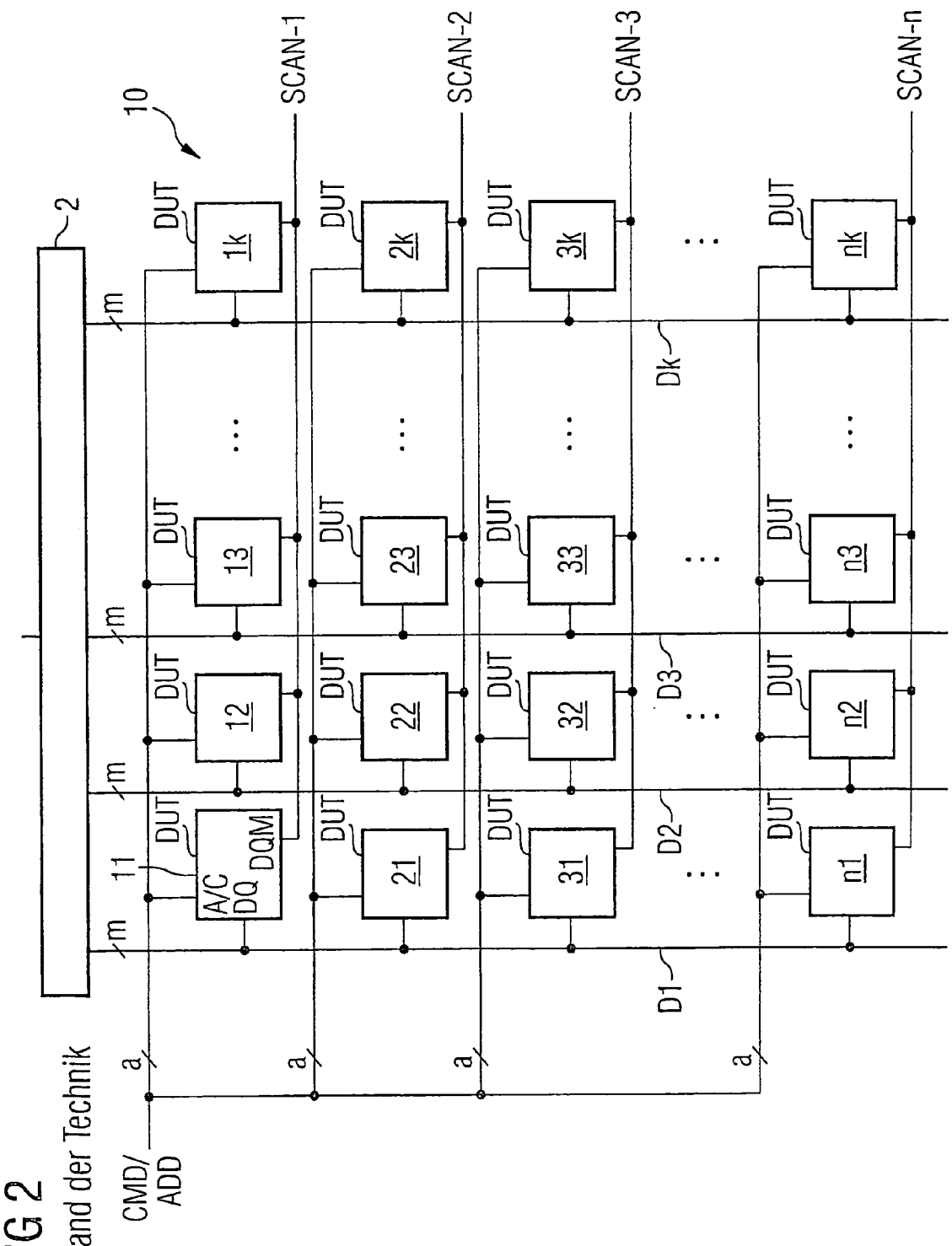
FIG. 2 shows an embodiment of a test apparatus according to the prior art, as described above.

The SCAN signals can be used to drive, via the switching transistors T1 to Tn, the addresses and commands of those modules, in the group to be activated. In addition, the SCAN signal can be connected to the CS terminal of the modules instead of, as previously and as illustrated in FIG. 2, to the DQM terminal. In accordance with the test arrangement shown in FIG. 1, DQM terminal may now be connected to a free command terminal of the test unit. The SCAN signal can select addresses and commands for the active modules, with the result that the load on the corresponding drivers can be reduced. Selected modules at a higher frequency, in particular, in a test during burn-in, or to increase the number of modules per burn-in board can be operated.

The modules, which have been deactivated via the CS signal, can be in the deactivated state or in the power-down mode. In the case of DRAMs, the data of the deactivated chips can be refreshed by a "self refresh," which is carried out automatically by the chip. With an increasing number of deactivated chips, a reduced power consumption can result. If a chip has been deactivated via the CS signal, the chip does not drive any data via the DQ terminal, does not receive any data via the DQ terminal, and does not identify any commands at the terminal A/C.

In one embodiment of the invention, the modules which are located on the carrier substrate can be subject, during the method, to a functional test at increased operating frequency, and beforehand and/or afterward to a burn-in test (which is different from the functional test) on the same carrier substrate, in the burn-in test, the modules being operated at, in comparison, a lower operating frequency. Comparatively slow burn-in tests can be carried out by driving a plurality of or all SCAN signals using an operating current or driver load which can nevertheless be handled by the test system and with a high level of parallelism. However, the current-critical and, respectively, frequency-critical tests of modules, which are carried out on the same carrier substrate, can be carried out with a reduced level of parallelism in accordance with the method according to the invention, with the result that the test frequency can be increased without adversely affecting the driver load. The test system is no longer restricted by the power consumption which can be handled during a test during burn-in, with the result that it is possible to increase the number of modules which are simultaneously subjected to a burn-in test on the test board.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Carrier substrate
2 Test unit
10 Carrier substrate
11 to nk Connection location
DUT Integrated module
T1 to Tn Switching means
D1 to Dk Data bus
SCAN-1 to SCAN-n Control bus
CMD/ADD Address and command bus
A/C Address and command terminal
DQ Data terminal
CS Control terminal
R1 to Rn Row
S1 to Sk Column
m, a Bit width

We claim:

1. A test apparatus for testing integrated modules, comprising:
   a carrier substrate, having a plurality of connection locations arranged thereon, the connection locations being designed such that an integrated module is connected to a test unit connected to the carrier substrate via a connection location, the connection locations forming a connection array, the connection locations being arranged in groups within the connection array;
   a data terminal provided for each connection location, the data terminals of connection locations of a respective group being connected to a respective different data bus;
   a control terminal provided for each connection location, the control terminal selecting the integrated module for a test, the control terminals of connection locations of a respective group being connected to a control bus assigned to this group; and
   an address and command terminal provided for each connection location, the address and command terminals of connection locations of a respective group being connected to an address and command bus via a respective switching means, which is assigned to the respective group and controlled by the control bus assigned to this group.

2. The test apparatus as claimed in claim 1, wherein the connection locations are arranged in rows and columns within the connection array,
   the data terminals of connection locations of a respective column are connected to a data bus assigned to this column,
   the control terminals of connection locations of a respective row are connected to a control bus assigned to this row, and
   the address and command terminals of connection locations of a respective row are connected to a common address and command bus via a respective switching means, which may be controlled by the control bus assigned to this row.

3. The test apparatus as claimed in claim 1, wherein the carrier substrate is in the form of a burn-in test board.

4. A method for operating a test apparatus, the test apparatus including at least some connection locations on the carrier substrate being connected to integrated modules to be tested, the connection locations forming a connection array, the connection locations being arranged in groups within the connection array, a control terminal provided for each connection location, the control terminal selecting the integrated module for a test, the control terminals of connection locations of a respective group being connected to control bus assigned to this group, and an address and command terminal provided for each connection location, the address and command terminals of connection locations of a respective group being connected to an address and command bus via a respective switching means, which is assigned to the respective group and controlled by the control bus assigned to this group, the method comprising:
   driving a corresponding control bus by a control signal to simultaneously operate and drive modules of a number of groups of connection locations, wherein the number is less than the number of groups present on the carrier substrate;
   activating the respective switching means connected to the driven group of connection locations by using the control signal; and
   in simultaneously operating the modules of the number of groups, the groups being connected to the address and command bus via the respective switching means.

5. The method as claimed in claim 4, wherein the connection locations are arranged in rows and columns within the connection array and the modules of a number of rows are simultaneously operated and driven, the number being smaller than the number of rows present on the carrier substrate, and the modules of the number of rows which are simultaneously operated are connected to the address and command bus via the respective switching means.

6. The method as claimed in claim 4, wherein the modules which interchange data via the assigned data bus are operated and driven.

7. The method as claimed in claim 4, wherein the modules are subject to a functional test and beforehand and/or afterward to a burn-in test on the same carrier substrate.

8. The method as claimed in claim 7, wherein the modules are operated at a first operating frequency in the burn-in test and at a second operating frequency in the functional test, the first operating frequency being smaller than the second operating frequency.

9. The method as claimed in claim 7, wherein, during a burn-in test, driving the corresponding control buses simultaneously operates the modules of all groups, and the modules of the groups are connected to the address and command bus via the respective switching means.

10. A test apparatus for testing integrated modules, comprising:
    a carrier substrate having a plurality of connection locations arranged thereon, the connection locations being designed such that an integrated module is connected to a test unit connected to the carrier substrate via a connection location, the connection locations forming a connection array, the connection locations being arranged in groups within the connection array;

a data terminal provided for each connection location, the data terminals of connection locations of a respective group being connected to a respective different data bus;

a control terminal provided for each connection location, the control terminal selecting the integrated module for a test, the control terminals of connection locations of a respective group being connected to a control bus assigned to this group; and an address and command terminal provided for each connection location, the address and command terminals of connection locations of a respective group being connected to an address and command bus via a respective switch, which is assigned to the respective group and controlled by the control bus assigned to this group.

11. The test apparatus as claimed in claim 10, wherein the connection locations are arranged in rows and columns within the connection array, the data terminals of connection locations of a respective column are connected to a data bus assigned to this column, the control terminals of connection locations of a respective row are connected to a control bus assigned to this row, and the address and command terminals of connection locations of a respective row are connected to a common address and command bus via a respective switch, which may be controlled by the control bus assigned to this row.

12. The test apparatus as claimed in claim 10, wherein the carrier substrate is in the form of a burn-in test board.

13. A method for operating a test apparatus, the test apparatus including at least some connection locations on the carrier substrate being connected to integrated modules to be tested, the connection locations forming a connection array, the connection locations being arranged in groups within the connection array, a control terminal provided for each connection location, the control terminal selecting the integrated module for a test, the control terminals of connection locations of a respective group being connected to control bus assigned to this group, and an address and command terminal provided for each connection location, the address and command terminals of connection locations of a respective group being connected to an address and command bus via a respective switch, which is assigned to the respective group and controlled by the control bus assigned to this group, the method comprising:

driving a corresponding control bus by a control signal to simultaneously operate and drive modules of a number of groups of connection locations, wherein the number is less than the number of groups present on the carrier substrate;

activating the respective switch connected to the driven group of connection locations by using said control signal; and in simultaneously operating the modules of the number of groups, the groups being connected to the address and command bus via the respective switch.

14. The method as claimed in claim 13, wherein the connection locations are arranged in rows and columns within the connection array and the modules of a number of rows are simultaneously operated and driven, the number being smaller than the number of rows present on the carrier substrate, and the modules of the number of rows which are simultaneously operated are connected to the address and command bus via the respective switch.

15. The method as claimed in claim 13, wherein the modules which interchange data via the assigned data bus are operated and driven.

16. The method as claimed in claim 13, wherein the modules are subjected to a functional test and beforehand and/or afterward to a burn-in test on the same carrier substrate.

17. The method as claimed in claim 16, wherein the modules are operated at a first operating frequency in the burn-in test and at a second operating frequency in the functional test, the first operating frequency being smaller than the second operating frequency.

18. The method as claimed in claim 16, wherein during a burn-in test, driving the corresponding control buses simultaneously operates the modules of all groups, and the modules of the groups are connected to the address and command bus via the respective switch.

* * * * *